US010954440B2

United States Patent
Won et al.

(10) Patent No.: US 10,954,440 B2
(45) Date of Patent: Mar. 23, 2021

(54) QUANTUM DOTS AND DEVICES INCLUDING THE SAME

(71) Applicant: SAMSUNG ELECTRONICS CO., LTD., Suwon-si (KR)

(72) Inventors: Yuho Won, Seoul (KR); Sung Woo Kim, Hwaseong-si (KR); Jin A Kim, Suwon-si (KR); Jeong Hee Lee, Seongnam-si (KR); Tae Hyung Kim, Seoul (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/298,108

(22) Filed: Mar. 11, 2019

(65) Prior Publication Data

US 2019/0276737 A1    Sep. 12, 2019

(30) Foreign Application Priority Data

Mar. 9, 2018    (KR) .......................... 10-2018-0028321

(51) Int. Cl.
*H01L 51/50*    (2006.01)
*C09K 11/88*    (2006.01)
(Continued)

(52) U.S. Cl.
CPC ............ *C09K 11/883* (2013.01); *C09K 11/02* (2013.01); *H01L 51/502* (2013.01);
(Continued)

(58) Field of Classification Search
CPC ......... B82Y 40/00; B82Y 30/00; B82Y 20/00; C09K 11/883; C09K 11/0811; C09K 11/574
(Continued)

(56) References Cited

U.S. PATENT DOCUMENTS 5,140,385 A    8/1992    Kukimoto et al.
9,698,311 B2   7/2017    Greco et al.
(Continued)

FOREIGN PATENT DOCUMENTS

CN    105399136 A    3/2016
CN    105830236 A    8/2016
(Continued)

OTHER PUBLICATIONS

Aqiang Wang et al., "Bright, efficient, and color-stable violet ZnSe-based quantum dot light-emitting diodes," Nanoscale, Jan. 5, 2015, pp. 2951-2959, vol. 7.
(Continued)

*Primary Examiner* — Jonathan Han
(74) *Attorney, Agent, or Firm* — Cantor Colburn LLP

(57) ABSTRACT

A quantum dot including: a core including a first semiconductor nanocrystal material including zinc, tellurium, and selenium; and a semiconductor nanocrystal shell disposed on the core, the semiconductor nanocrystal shell including zinc, selenium, and sulfur, wherein the quantum dot does not include cadmium, and in the quantum dot, a mole ratio of the sulfur with respect to the selenium is less than or equal to about 2.4:1. A production method of the quantum dot and an electronic device including the same are also disclosed.

23 Claims, 4 Drawing Sheets

(51) Int. Cl.
*C09K 11/02* (2006.01)
*H05B 33/14* (2006.01)
*B82Y 20/00* (2011.01)
*B82Y 40/00* (2011.01)

(52) U.S. Cl.
CPC ...... *H01L 51/5056* (2013.01); *H01L 51/5072* (2013.01); *H01L 51/5088* (2013.01); *H01L 51/5092* (2013.01); *H05B 33/14* (2013.01); *B82Y 20/00* (2013.01); *B82Y 40/00* (2013.01)

(58) Field of Classification Search
USPC .......... 977/774; 252/519.14, 519.4, 301.6 R
See application file for complete search history.

(56) References Cited

U.S. PATENT DOCUMENTS

| | | | |
|---|---|---|---|
| 9,887,318 | B2 | 2/2018 | Titov et al. |
| 9,957,442 | B2 | 5/2018 | Banin et al. |
| 2005/0214536 | A1* | 9/2005 | Schrier .................. H01L 33/28 428/403 |
| 2009/0108235 | A1 | 4/2009 | Ando et al. |
| 2009/0230382 | A1 | 9/2009 | Banin et al. |
| 2010/0025637 | A1 | 2/2010 | Asokan et al. |
| 2010/0044635 | A1* | 2/2010 | Breen .................. C09K 11/025 252/301.6 S |
| 2013/0115455 | A1 | 5/2013 | Banin et al. |
| 2014/0117292 | A1* | 5/2014 | Jun .................... H01L 31/0304 252/519.14 |
| 2014/0339497 | A1 | 11/2014 | Qu et al. |
| 2015/0262727 | A1* | 9/2015 | Cho .................... C09K 11/565 252/519.2 |
| 2016/0160060 | A1* | 6/2016 | Kikuchi .................. H05B 33/12 313/503 |
| 2016/0167965 | A1* | 6/2016 | Jang .................... C01B 19/007 252/519.14 |
| 2016/0225958 | A1 | 8/2016 | Kazama et al. |
| 2016/0333267 | A1 | 11/2016 | Chen et al. |
| 2017/0352779 | A1 | 12/2017 | Kuzumoto et al. |
| 2018/0026166 | A1 | 1/2018 | Kazama et al. |
| 2018/0158985 | A1 | 6/2018 | Titov et al. |
| 2018/0201834 | A1 | 7/2018 | Banin et al. |

FOREIGN PATENT DOCUMENTS

| | | |
|---|---|---|
| CN | 106381146 A | 2/2017 |
| EP | 3037195 A1 | 6/2016 |
| EP | 3401380 A1 | 11/2018 |
| JP | 2016145328 A | 8/2016 |
| KR | 20040032456 A | 4/2004 |
| KR | 20120088273 A | 8/2012 |
| KR | 20130102072 A | 9/2013 |
| KR | 20140121351 A | 10/2014 |
| KR | 20150035300 A | 4/2015 |
| KR | 20170080795 A | 7/2017 |
| WO | 2012161065 A1 | 11/2012 |

OTHER PUBLICATIONS

Huaibin Shen et al., "Phosphine-free synthesis of high quality ZnSe, ZnSe/ZnS, and Cu-, Mn-doped ZnSe nanocrystals," Dalton Transactions, Oct. 30, 2009, pp. 10534-10540.

Kipil Lim et al., "Synthesis of blue emitting InP/ZnS quantum dots through control of competition between etching and growth," Nanotechnology, Nov. 9, 2012, pp. 1-7, vol. 23, No. 485-609.

Angela Fiore et al., "Raman and photoluminescence spectra of ZnTe/CdSe and ZnTe/CdTe tetrapod shaped nano-hetero structures," Superlattices and Microstructures, Oct. 27, 2017, pp. 143-146, vol. 113.

Extended European Search Report dated Jul. 9, 2019, of the corresponding European Patent Application No. 19161979.0.

Non-Final Office Action dated Mar. 24, 2020 in U.S. Appl. No. 16/298,357.

Ohristian Ippen et al., "ZnSe/ZnS quantum dots as emitting material in blue QD-LEDs with narrow emission peak and wavelength tunability," Organic Electronics, Nov. 15, 2013, pp. 126-131. vol. 15.

Extended European Search Report dated Jul. 9, 2019, of the corresponding European Patent Application No. 19161974.1.

Huaibin Shen et al., "Size- and shape-controlled synthesis of ZnSe nanocrystals using SeO2 as selenium precursor," Dalton Transactions, Oct. 26, 2010, pp. 11432-11438, vol. 39.

Joren Eilers et al., "Unravelling the Size and Temperature Dependence of Exciton Lifetimes in Colloidal ZnSe Quantum Dots," The Journal of Physical Chemistry, Sep. 22, 2014, pp. 23313-23319, vol. 118, Issue No. 40.

Lanlan Chen et al., "Green chemical approaches to ZnSe quantum dots: preparation, characterisation and formation mechanism," Journal of Experimental Nanoscience, Mar. 24, 2010, pp. 106-117, vol. 5, No. 2.

Non-Final Office Action, dated Feb. 13, 2020 of U.S. Appl. No. 16/297,923.

Nenyu Ji et al., "High color purity ZnSe/ZnS core/shell quantum dot based blue light emitting diodes with an inverted device structure," Applied Physics Letters, Jul. 30, 2013, pp. 053106-1-053106-4, vol. 103.

Chunliang Li et al., "Synthesis of Cd-free water-soluble ZnSe1—xTex nanocrystals with high luminescence in the blue region," Journal of Colloid and Interface Science, Feb. 14, 2008, pp. 468-476, vol. 321.

Kiran G Sonawane, Ch Rajesh, Mayur Temgire, Shailaja Mahamuni. A case study: Te in ZnSe and Mn-doped ZnSe quantum dots. Nanotechnology 2011, 22 (30), 305702.

* cited by examiner

QUANTUM DOTS AND DEVICES INCLUDING THE SAME

CROSS-REFERENCE TO RELATED APPLICATION

This application claims priority to and the benefit of Korean Patent Application No. 10-2018-0028321 filed in the Korean Intellectual Property Office on Mar. 9, 2018, and all the benefits accruing therefrom under 35 U.S.C. § 119, the entire content of which is incorporated herein by reference.

BACKGROUND

1. Field

A quantum dot and a device including the same are disclosed.

2. Description of the Related Art

Unlike bulk materials, physical characteristics (e.g., energy bandgaps and melting points) of nanoparticles may be controlled by changing the nanoparticle sizes. For example, a semiconductor nanocrystal particle (also known as a quantum dot) is a crystalline material having a size of several nanometers. The semiconductor nanocrystal particle has a relatively small size and a large surface area per unit volume and exhibits a quantum confinement effect, and thus may have different properties than bulk materials having the same composition. A quantum dot may absorb light from an excitation source to be excited, and may emit energy corresponding to an energy bandgap of the quantum dot.

Quantum dots may be synthesized using a vapor deposition method such as metal organic chemical vapor deposition (MOCVD), molecular beam epitaxy (MBE), or the like, a wet chemical method including adding precursor materials to an organic solvent to grow crystals, or the like. In the wet chemical method, organic compounds such as ligands/coordinating solvents may be coordinated on, e.g., bound to, surfaces of nanocrystals to control crystal growth.

In order to improve photoluminescence properties of quantum dots, a core-shell structure may be used, but core-shell quantum dots having improved properties may be cadmium-based materials. Accordingly, there remains a need for development of cadmium-free semiconductor nanocrystal particles having desirable photoluminescence properties.

SUMMARY

An embodiment provides a cadmium-free semiconductor nanocrystal particle capable of emitting blue light with improved efficiency.

An embodiment provides a method of manufacturing the semiconductor nanocrystal particle.

An embodiment provides an electronic device including the semiconductor nanocrystal particle.

In an embodiment, a quantum dot includes a core including a first semiconductor nanocrystal material including zinc, tellurium, and selenium; and a semiconductor nanocrystal shell disposed on at least a portion of the core, the semiconductor nanocrystal shell including a second semiconductor nanocrystal material comprising zinc, selenium, and sulfur, wherein the quantum dot does not include cadmium, and a mole ratio of sulfur with respect to selenium is less than or equal to about 2.4:1.

A maximum photoluminescent peak wavelength of the quantum dot may be greater than or equal to about 430 nanometers (nm) and less than or equal to about 480 nm.

The quantum dot may have a size of greater than or equal to about 10 nm.

In the quantum dot, a mole ratio of tellurium with respect to selenium may be less than or equal to about 0.05:1.

In the quantum dot, the mole ratio of sulfur with respect to selenium may be less than or equal to about 2:1.

In the quantum dot, the mole ratio of sulfur with respect to selenium may be less than or equal to about 1.85:1.

In the quantum dot, the mole ratio of sulfur with respect to selenium may be less than about 1.85:1.

In the quantum dot, the mole ratio of sulfur with respect to selenium may be less than or equal to about 1.8:1.

A size of the core may be greater than or equal to about 2 nm.

The core may include $ZnTeSe_{1-x}$, wherein x is greater than 0 and less than or equal to about 0.05.

The semiconductor nanocrystal shell may have a gradient composition varying in a radial direction from the core toward an outermost surface of the quantum dot.

In the semiconductor nanocrystal shell, an amount of the sulfur may increase in a radial direction from the core toward an outermost surface of the quantum dot.

The semiconductor nanocrystal shell may include a first layer disposed directly on the core and a second layer disposed on the first layer. The first layer may include a second semiconductor nanocrystal. The second layer may include a third semiconductor nanocrystal having a composition different from a composition of the second semiconductor nanocrystal.

The second semiconductor nanocrystal may include zinc, selenium, and sulfur. The third semiconductor nanocrystal may include zinc and sulfur.

The second layer may be an outermost layer and the third semiconductor nanocrystal may not include selenium.

A maximum photoluminescent peak wavelength of the quantum dot may be greater than or equal to about 445 nm.

A maximum photoluminescent peak wavelength of the quantum dot may be less than or equal to about 470 nm.

The quantum dot may have quantum efficiency of greater than or equal to about 70%.

A full width at half maximum (FWHM) of a maximum photoluminescent peak of the quantum dot may be less than about 30 nm.

The quantum dot may have a size of greater than or equal to about 12 nm.

In an embodiment, an electroluminescent device includes a first electrode and a second electrode facing each other, and a light emitting layer disposed between the first electrode and the second electrode, the light emitting layer including a quantum dot (e.g., a plurality of quantum dots), wherein the quantum dot includes the aforementioned quantum dot.

The electroluminescent device may further include a charge auxiliary layer between the first electrode and the light emitting layer, between the second electrode and the light emitting layer, or between the first electrode and the light emitting layer and between the second electrode and the light emitting layer.

The charge auxiliary layer may include a charge injection layer, a charge transport layer, or a combination thereof.

A peak external quantum efficiency of the electroluminescent device may be greater than or equal to about 4%.

The electroluminescent device may emit light having an x value of a CIE color space chromaticity diagram that is less than or equal to about 0.2.

In an embodiment, an electronic device includes the aforementioned quantum dot.

The electronic device may be a display device, a light emitting diode (LED), a quantum dot light emitting diode (QLED), an organic light emitting diode (OLED), a sensor, an image sensor, or a solar cell.

A cadmium-free quantum dot capable of emitting blue light may be provided. The quantum dot may be applied to, e.g., used in, various display devices, biolabeling (biosensor, bioimaging), a photodetector, a solar cell, a hybrid composite, or the like. The quantum dots of an embodiment may exhibit improved Exteral Quantum Efficiency (EQE) and increased Maximum brightness when they are applied, e.g., used, in an electroluminescent device. The quantum dots of an embodiment may exhibit decreased FWHM and increased quantum efficiency.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
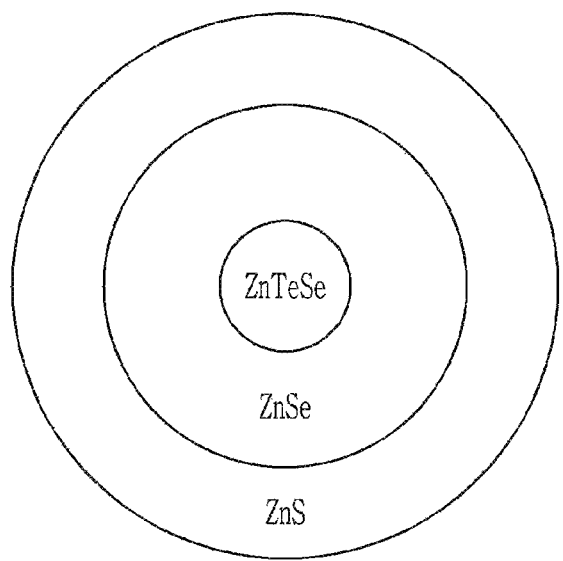
FIG. 1 is a schematic cross-sectional view of a semiconductor nanocrystal according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety, wherein at least one of hydrogen atoms thereof is replaced by a substituent, wherein the substituent may be a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

Herein, "aliphatic" refers to a saturated or unsaturated linear or branched hydrocarbon group. An aliphatic group may be an alkyl, alkenyl, or alkynyl group, for example.

As used herein, "alkyl" refers to a linear or branched saturated monovalent hydrocarbon group (methyl, ethyl, hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

Herein, "aromatic" refers to an organic compound or group comprising at least one unsaturated cyclic group having delocalized pi electrons. The term encompasses both hydrocarbon aromatic compounds and heteroaromatic compounds.

As used herein, "aryl" refers to a group formed by removal of at least one hydrogen from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, "Group" refers to a group of Periodic Table.

As used herein, the phrases "External Quantum Efficiency", "Quantum Efficiency", and "Quantum Yield" are interchangeable.

A core-shell structure may improve photoluminescence properties of quantum dots, but core-shell quantum dots having desirable properties may include cadmium. Provided are cadmium-free semiconductor nanocrystal particles having desirable photoluminescence properties.

Semiconductor nanocrystal particles (hereinafter, also referred to as a quantum dots) may absorb light from an excitation source and may emit light corresponding to an energy bandgap of the semiconductor nanocrystal particles.

The energy bandgap of the quantum dot may be changed depending on a size and a composition of the quantum dot. For example, as the size of the quantum dot increases, the quantum dot may have a narrower energy bandgap and may exhibit an increased light emitting wavelength. Semiconductor nanocrystals may be used as a light emitting material in various fields such as a display device, an energy device, or a bio light emitting device.

Quantum dots having relatively increased photoluminescence properties may include cadmium (Cd). The cadmium may raise environmental and/or health issues and is a restricted element defined under Restriction of Hazardous Substances Directive (RoHS) in a plurality of countries.

Accordingly, there remain a need for development of a cadmium-free quantum dot having improved photoluminescence characteristics. In order to be applied to, e.g., used in, a QLED display device, a quantum dot having a relatively narrow full width at half maximum (FWHM) and capable of emitting light of pure blue (e.g., PL peak around 455 nm) is desired. For example, a blue light emitting material is desired for a display device having a relatively high (e.g., about 90% or greater) color reproducibility under a next generation color standard such as BT2020. A cadmium-free quantum dot having desirable photoluminescence properties and PL peak within the foregoing ranges is provided.

A quantum dot according to an embodiment has a structure and a composition that will be described herein, and thereby may not include cadmium and may emit blue light.

The quantum dot includes a core including a first semiconductor nanocrystal material including zinc, tellurium, and selenium; and a semiconductor nanocrystal shell disposed on (at least a portion of) the core and including a second semiconductor nanocrystal material different from the first semiconductor nanocrystal material (and including zinc, selenium, and sulfur). The quantum dot does not include cadmium. In the quantum dot, a mole ratio of sulfur with respect to the selenium is less than or equal to about 2.4:1. The quantum dot may emit (blue)_light having a maximum photoluminescent peak wavelength in a range of greater than or equal to about 430 nanometers (nm) and less than or equal to about 480 nm.

The first semiconductor nanocrystal material of the core may include a limited amount of tellurium (Te). The core may include $ZnTeSe_{1-x}$, wherein x is greater than about 0 and less than or equal to about 0.05. In the core, the wavelength of the maximum light emitting peak of the quantum dot may be increased by increasing a ratio of an amount of tellurium relative to an amount of selenium. In the core, the amount of the tellurium may be greater than or equal to about 0.001 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, or greater than or equal to about 0.02:1 moles based on one mole of the selenium. In the core, the amount of the tellurium with respect to one mole of the selenium may be less than or equal to about 0.053 moles, for example, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, or less than or equal to about 0.04 moles.

The core or the quantum dot may not include manganese, copper, or a combination thereof.

In an embodiment, the semiconductor nanocrystal shell includes zinc (Zn), selenium (Se), and sulfur (S). The shell may be a multi-layered shell including a plurality of layers. In the plurality of layers for the shell, adjacent layers may have semiconductor nanocrystal material of different compositions. The multi-layered shell may include a first layer disposed directly on the core and a second layer disposed on or over the first layer. The first layer may include a second semiconductor nanocrystal. The second layer may include a third semiconductor nanocrystal having a composition different from the second semiconductor nanocrystal. The second layer may be the outermost layer of the quantum dot (see FIG. 1). The second semiconductor nanocrystal may include zinc, selenium, and optionally sulfur. The third semiconductor nanocrystal may include zinc and sulfur. The third semiconductor nanocrystal may not include selenium. In FIG. 1, a cross-section of the quantum dot is illustrated as a circle, but it is not limited thereto. The cross-section of the quantum dot may have any suitable shape.

In the shell or the multi-layered shell, each of the layer may include a gradient alloy having a composition varying in a direction of a radius, e.g., a radial direction from the core toward an outermost surface of the quantum dot. In an embodiment, an amount of the sulfur in the semiconductor nanocrystal shell may increase toward a surface of the quantum dot. For example, in the shell, the amount of the sulfur may increase in a direction away from the core, e.g., in a radial direction from the core toward an outermost surface of the quantum dot.

The quantum dot may have a mole ratio of tellurium relative to selenium (e.g., measured by inductively coupled plasma-atomic emission spectroscopy (ICP-AES)) of less than or equal to about 0.05:1, less than or equal to about 0.04:1, less than or equal to about 0.03:1, less than or equal to about 0.02:1, or less than or equal to about 0.01:1. The mole ratio of the tellurium to the selenium may be greater than or equal to about 0.001:1, greater than or equal to about 0.0015:1, greater than or equal to about 0.002:1, greater than or equal to about 0.0025:1, greater than or equal to about 0.003:1, greater than or equal to about 0.0035:1, greater than or equal to about 0.004:1, or greater than or equal to about 0.0045:1. The mole ratio of the tellurium to the selenium may be about 0.004:1 to about 0.01:1. The mole ratio of the tellurium to the selenium may be about 0.001:1 to about 0.02:1. The mole ratio of the tellurium to the selenium may be about 0.001:1 to about 0.03:1.

In the quantum dot, a mole ratio of the tellurium with respect to the zinc (e.g., determined by an inductively coupled plasma-atomic emission spectroscopy) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.010:1, less than or equal to about 0.009:1, less than or equal to about 0.008:1, less than or equal to about 0.007:1, less than or equal to about 0.006:1, or less than or equal to about 0.005:1. A mole ratio of the tellurium with respect to the zinc may be greater than or equal to about 0.001:1, for example, greater than or equal to about 0.0015:1

An amount of zinc (Zn) may be greater than that of selenium (Se). An amount of zinc (Zn) may be greater than that of selenium (Se) and an amount of selenium may be greater than that of tellurium, for example, as measured by an ICP-AES analysis of the semiconductor nanocrystal particle.

For example, in the ICP-AES analysis, a mole ratio of Se to Zn may be less than about 1:1, for example, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, or less than or equal to about 0.45:1. In an embodiment, (for example, in the ICP-AES analysis,) a mole ratio of Se to Zn may be greater than or equal to about 0.1:1, for example, greater than or equal to about 0.2:1, or greater than or equal to about 0.3:1.

In the quantum dot, a mole ratio of sulfur to Zn may be greater than or equal to about 0.1:1, for example, greater than or equal to about 0.15:1, greater than or equal to about 0.2:1, or greater than or equal to about 0.3:1, greater than or equal to about 0.4:1. In the quantum dot, the mole ratio of sulfur to Zn may be less than or equal to about 0.9:1, for example, less than or equal to about 0.8:1, less than or equal to about 0.7:1, or less than or equal to about 0.6:1.

In the quantum dot, a mole ratio of Se+S to zinc ((Se+S):Zn) may be greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.85:1, or greater than or equal to about 0.89:1. In the semiconductor nanocrystal particle, a mole ratio of Se and S to zinc may be less than or equal to about 1:1.

In the quantum dot, a mole ratio of sulfur with respect to selenium is less than or equal to about 2.4:1. In the quantum dot, a mole ratio of sulfur with respect to selenium may be less than or equal to about 2:1, less than or equal to about 1.95:1, less than or equal to about 1.9:1, less than or equal to about 1.85:1, less than or equal to about 1.80:1, less than or equal to about 1.40:1, less than or equal to about 1.25:1, less than or equal to about 1.19:1, less than or equal to about 0.95:1, or less than or equal to about 0.80:1. In a quantum dot of an embodiment, a mole ratio of sulfur with respect to selenium may be greater than or equal to about 0.4:1, greater than or equal to about 0.5:1, greater than or equal to about 0.6:1, greater than or equal to about 0.7:1, greater than or equal to about 0.95:1, greater than or equal to about 1:1, greater than or equal to about 1.1:1, greater than or equal to about 1.23:1, greater than or equal to about 1.25:1, greater than or equal to about 1.3:1, greater than or equal to about 1.4:1, or greater than or equal to about 1.95:1.

With the aforementioned ratios between the components, the quantum dot of an embodiment may emit blue light with improved quantum efficiency (e.g., of greater than or equal to about 70%, for example, greater than or equal to about 71%, greater than or equal to about 72%, greater than or equal to about 73%, greater than or equal to about 74%, or greater than or equal to about 75%) and a decreased FWHM (e.g., of less than about 30 nm, less than or equal to about 25 nm, or less than or equal to about 22 nm). The quantum dot may have a quantum efficiency of greater than or equal to about 80%, greater than or equal to about 90%, greater than or equal to about 95%, greater than or equal to about 99%, or 100%.

The quantum dot may include various shapes. The shape of the quantum dot may include a spherical shape, a polygonal shape, a multipod shape, or a combination thereof. In an embodiment, the quantum dot may have a multipod shape. The multipod may have at least two (e.g., at least three or at least four) branch parts and a valley part therebetween.

A size of the core may be greater than or equal to about 2 nm, for example, greater than or equal to about 3 nm or greater than or equal to about 4 nm. A size of the core may be less than or equal to about 6 nm, for example, less than or equal to about 5 nm. The quantum dot may have a relatively large size and may emit blue light, and thus may have enhanced stability and be handled relatively easily. In an embodiment, the quantum dot may have a size of greater than or equal to about 10 nm, for example, greater than or equal to about 11 nm, or even greater than or equal to about 12 nm. In an embodiment, a size of the quantum dot may refer to a diameter. In a case in which the quantum dot is non-spherical shape, a size of the quantum dot may refer to a diameter calculated from a two-dimensional image obtained from an electron microscopic analysis (e.g., under an assumption that the image is a circle). The size of the quantum dot may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm.

A quantum dot of an embodiment may emit blue light having a maximum peak emission at a wavelength of greater than or equal to about 430 nm, e.g., greater than or equal to about 440 nm, greater than or equal to about 445 nm, greater than or equal to about 447 nm, greater than or equal to about 448 nm, greater than or equal to about 449 nm, or greater than or equal to about 450 nm, and less than or equal to about 480 nm, e.g., less than or equal to about 475 nm, less than or equal to about 470 nm, less than or equal to about 465 nm, less than or equal to about 460 nm, or less than or equal to about 455 nm. The blue light may have a maximum light-emitting peak wavelength of from about 450 nm to about 460 nm.

The maximum peak emission may have a full width at half maximum (FWHM) of less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

Cadmium free quantum dots may not emit blue light of a desired wavelength (for example, greater than or equal to about 430 nm and less than or equal to about 470 nm) with enhanced efficiency and a narrow FWHM. For example, an indium phosphide quantum dot has a relatively low efficiency and it may not be possible to control an emission wavelength of a ZnSe quantum dot to be greater than about 430 nm. The quantum dot of an embodiment may emit blue light with improved efficiency and a narrow FWHM. In addition, the quantum dot of an embodiment may exhibit increased maximum EQE in an electroluminescent device.

In an embodiment, a method of producing the quantum dot includes preparing a core including a first semiconductor nanocrystal including zinc, selenium, and tellurium (hereinafter, also referred to as a core); and reacting a zinc precursor, and a selenium precursor, a sulfur precursor, or a combination thereof a plurality of times in the presence of the core and an organic ligand in an organic solvent to form a semiconductor nanocrystal shell including zinc, selenium, and sulfur and having the aforementioned composition on a surface of the core.

The formation of the semiconductor nanocrystal shell may include reacting the zinc precursor and the selenium precursor, and then reacting the zinc precursor and the sulfur precursor.

In an embodiment, the core may be obtained by preparing a zinc precursor solution including a zinc precursor and an organic ligand; preparing a selenium precursor and a tellurium precursor; heating the zinc precursor solution to a first reaction temperature and adding the selenium precursor and the tellurium precursor thereto optionally together with an organic ligand to proceed a reaction therebetween.

The zinc precursor may include a Zn powder, ZnO, an alkylated Zn compound (e.g., C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon group such as hexadecane, octadecane, or squalane, an aromatic hydrocarbon group substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a primary, secondary, or tertiary phosphine oxide (e.g., trioctylphosphine oxide) substituted with a (e.g., 1, 2, or 3) C6 to C22 alkyl group(s), a C12 to C22 aromatic ether such as a phenyl ether or a benzyl ether, or a combination thereof.

The organic ligand may coordinate, e.g., be bound to, the surface of the produced nanocrystal and may have an effect on the light emitting and electric characteristics as well as may effectively disperse the nanocrystal in the solution phase. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, $R_2POOH$, wherein R is the same or different and is each independently hydrogen, a substituted or unsubstituted C1 to C24 (or C3 to C40) aliphatic hydrocarbon group, a substituted or unsubstituted C6 to C20 (or C6 to C40) aromatic hydrocarbon group, or a combination thereof provided that at least one of the R is not hydrogen, or a combination thereof. One or more ligands may be may be used.

Examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine such as methyl phosphine, ethyl phosphine, propyl phosphine, butyl phosphine, pentyl phosphine, tributylphosphine, or trioctylphosphine; a phosphine oxide such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, or the like, but are not limited thereto. One or more organic ligand compounds may be used. In an embodiment, the organic ligand compound may be a combination of RCOOH and amine, e.g., $RNH_2$, $R_2NH$, and/or $R_3N$, wherein R is as defined above.

In the core including the first semiconductor nanocrystal, a mole ratio of tellurium with respect to selenium may be less than or equal to about 0.05:1. In order to form the core, an amount of the selenium precursor for forming the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles based on one mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles based on one mole of the tellurium precursor. Within the foregoing ranges of the amount, the core having the aforementioned composition may be formed.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, but is not limited thereto. By controlling the reaction time, the size of the core may be controlled.

Reaction conditions for forming the shell may be selected appropriately in light of a desired composition of the shell. In an embodiment, a solvent and optionally an organic ligand may be heated (and/or placed under vacuum) at a predetermined temperature (e.g., at a temperature of greater than or equal to about 100° C.) and an atmosphere is changed into an inert gas and then is heated at a predetermined temperature (e.g., at a temperature of greater than or equal to about 100° C.). Then, a core may be injected, and shell precursors may be injected sequentially or simultaneously and a resulting mixture is heated to to a predetermined reaction temperature to carry out a reaction.

A mixture having different ratios of the shell precursors may be sequentially added for a given period of time, e.g., a reaction time, to achieve a desired composition of the quantum dot or to form a gradient or a multi-layered shell on the core. In an embodiment, a first layer may be formed by reacting a zinc precursor and a selenium precursor and then a second layer may be formed by reacting a zinc precursor and a sulfur precursor. A reaction temperature for forming the shell may be greater than or equal to about 280° C., for example, greater than or equal to about 290° C., greater than or equal to about 300° C. and less than or equal to about 330° C., or less than or equal to about 325° C.

In a reaction system, an amount and a concentration of the precursor may be selected considering the compositions of the core and the shell and the reactivity between the precursors.

After the completion of the reaction, a non-solvent is added to reaction products and the nanocrystal particles coordinated with, e.g., bound to, the ligand compound may be separated. The non-solvent may be a polar solvent that is miscible with the solvent used in the core formation and/or shell formation reactions and is not capable of dispersing the produced nanocrystals therein. The non-solvent may be selected depending the solvent used in the reaction and may be, for example, acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing solvent and washed, if desired. The washing solvent is not particularly limited and a solvent having similar solubility parameter to that of the ligand may be used and examples thereof may include hexane, heptane, octane, chloroform, toluene, benzene, or the like.

The quantum dots of the embodiment may not dispersible to water, any of the foregoing listed non-solvent, or a mixture thereof. The quantum dots of the embodiment may be water-insoluble. The quantum dots of the embodiments may be dispersed the aforementioned organic solvent. In some embodiments, the quantum dots may be dispersed in a C6 to C40 aliphatic hydrocarbon, a C6 to C40 aromatic hydrocarbon, or a mixture thereof.

In an embodiment, an electronic device includes the semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a photoluminescent element (e.g., a lighting such as a quantum dot sheet or a quantum dot rail or a liquid crystal display (LCD)) or an electroluminescent device (e.g., QD LED).

In an embodiment, the electronic device may include a quantum dot sheet and the quantum dot may be included in the quantum dot sheet (e.g., in a form of a semiconductor nanocrystal-polymer composite).

Figure 2:
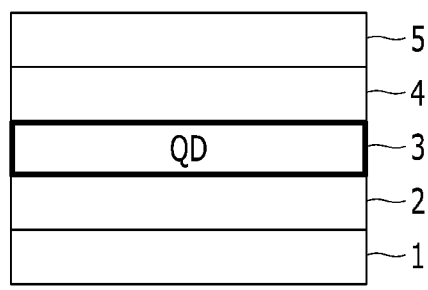
FIG. 2 is a schematic cross-sectional view of a quantum dot (QD) LED device according to an embodiment.

In an embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the blue light emitting semiconductor nanocrystal particle (see FIG. 2).

The cathode may include an electron injection conductor (for example, having a relatively low work function). The anode may include a hole injection conductor (for example, having a relatively high work function). The electron/hole injection conductors may include a metal (e.g., aluminum, magnesium, tungsten, nickel, cobalt, platinum, palladium, or calcium), a metal compound (e.g., LiF), an alloy, or a combination thereof; a metal oxide such as gallium indium oxide or indium tin oxide; or a conductive polymer such as polyethylene dioxythiophene (e.g., having a relatively high work function), but are not limited thereto.

At least one of the cathode and the anode may be a light transmitting electrode or a transparent electrode. In an embodiment, both of the anode and the cathode may be light transmitting electrodes. The electrode may be patterned.

The light transmitting electrode may be made of, for example, a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multi-layer, but is not limited thereto. When one of the cathode and the anode is a non-light transmitting electrode, the cathode or the anode may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 μm less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the blue light emitting semiconductor nanocrystal particle according to the aforementioned embodiments. The quantum dot emission layer may include a monolayer of the blue light emitting semiconductor nanocrystal particles.

The emissive layer may be formed by preparing a dispersion including the quantum dots dispersed in a solvent, applying the dispersion via spin coating, ink jet coating, or spray coating, and drying the same. The emissive layer may have a thickness of greater than or equal to about 5 nm, for example, greater than or equal to about 10 nm, greater than or equal to about 15 nm, greater than or equal to about 20 nm, or greater than or equal to about 25 nm, and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

The electronic device may include charge (hole or electron) auxiliary layers between the anode and the cathode. For example, the electronic device may include a hole auxiliary layer 2 between the anode and the quantum dot emission layer and/or an electron auxiliary layer 4 between the cathode and the quantum dot emission layer. (see FIG. 2)

In the figures, the electron/hole auxiliary layer is formed as a single layer, but the electron/hole auxiliary layer is not limited thereto and may include a plurality of layers including at least two stacked layers.

The hole auxiliary layer may include, for example, a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, but is not limited thereto. The hole injection layer may be an organic layer that is formed by a solution process (e.g., spin coating etc.) such as poly(3,4-ethylenedioxythiophene):poly(styrene sulfonate) (PEDOT:PSS). The hole transport layer may be an organic layer that is formed by a solution process (e.g., spin coating, etc.).

The electron auxiliary layer may include, for example, an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, but is not limited thereto. The electron injection layer may be an organic layer formed by deposition. The electron transport layer may include an inorganic oxide or (nano or fine) inorganic oxide particles or may include an organic layer formed by deposition.

The quantum dot emission layer may be disposed in the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include, for example, an organic material, an inorganic material, or an organic/inorganic material. The organic material may be a compound having hole or electron-related properties. The inorganic material may be, for example, a metal oxide such as molybdenum oxide, tungsten oxide, zinc oxide, or nickel oxide, but is not limited thereto.

The hole transport layer (HTL) and/or the hole injection layer may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB), a polyarylamine, poly(N-vinylcarbazole) (PVK), polyaniline, polypyrrole, N,N,N',N'-tetrakis (4-methoxyphenyl)-benzidine (TPD), 4,4',-bis[N-(1-naphthyl)-N-phenyl-amino]biphenyl (α-NPD), m-MTDATA (4,4',4"-tris[phenyl (m-tolyl)amino]triphenylamine), 4,4',4"-tris(N-carbazolyl)-triphenylamine (TCTA), 1,1-bis[(di-4-tolylamino)

phenylcyclohexane (TAPC), a p-type metal oxide (e.g., NiO, WO$_3$, MoO$_3$, etc.), a carbonaceous material such as graphene oxide, or a combination thereof, but is not limited thereto.

The electron blocking layer (EBL) may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N,N, N',N'-tetrakis(4-methoxyphenyl)-benzidine (TPD), 4,4'-bis[N-(1-naphthyl)-N-phenyl-amino]biphenyl (α-NPD), m-MTDATA, 4,4',4''-tris(N-carbazolyl)-triphenylamine (TCTA), or a combination thereof, but is not limited thereto.

The electron transport layer (ETL) and/or the electron injection layer may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., a zinc oxide, HfO$_2$, etc.), 8-(4-(4,6-di(naphthalen-2-yl)-1,3,5-triazin-2-yl)phenyl)quinolone:8-hydroxyquinolinato lithium (ET204:Liq), 2,2',2''-(1,3,5-Benzinetriyl)-tris (1-phenyl-1-H-benzimidazole) (TPBi) or a combination thereof, but is not limited thereto. In the foregoing "q" is 8-hydroxyquinoline, "BTZ" is 2-(2-hydroxyphenyl)benzothiazolate, and "Bq" is 10-hydroxybenzo[h]quinoline.

The hole blocking layer (HBL) may include, for example, 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, or a combination thereof, but is not limited thereto.

Figure 3:
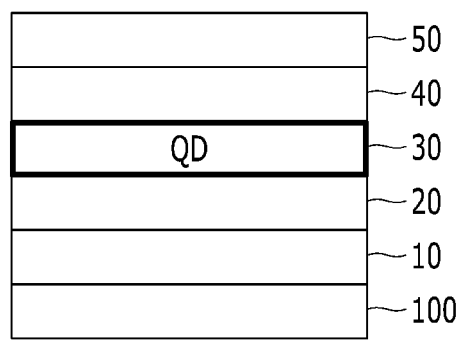
FIG. 3 is a schematic cross-sectional view of a QD LED device according to an embodiment.

In a device according to an embodiment, an anode 10 disposed on a transparent substrate 100 may include a metal oxide transparent electrode (e.g., ITO electrode) and a cathode 50 facing the anode may include a metal (Mg, Al, etc.) of a predetermined (e.g., relatively low) work function. TFB and/or PVK, for example, as a hole transport layer 20 and PEDOT:PSS and/or a p-type metal oxide, for example, as a hole injection layer 20 may be disposed between the transparent electrode 10 and the emission layer 30. An electron auxiliary layer (e.g., electron transport layer) 40 may be disposed between the quantum dot emission layer 30 and the cathode 50. (see FIG. 3) A device according to an embodiment has an inverted structure.

Figure 4:
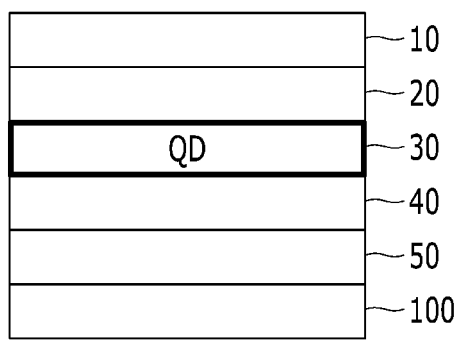
FIG. 4 is a schematic cross-sectional view of a QD LED device according to an embodiment.

Herein, a cathode 50 disposed on a transparent substrate 100 may include a metal oxide transparent electrode (e.g., ITO) and an anode 10 facing the cathode may include a metal (e.g., Au, Ag, etc.) of a predetermined (e.g., relatively high) work function. For example, an n-type metal oxide (ZnO) may be disposed between the transparent electrode 50 and the emission layer 30 as an electron auxiliary layer (e.g., an electron transport layer) 40. A hole auxiliary layer 20 (e.g., a hole transport layer including TFB and/or PVK and/or a hole injection layer including MoO$_3$ or another p-type metal oxide) may be disposed between the metal anode 10 and the quantum dot emission layer 30. (see FIG. 4)

Hereinafter, specific examples are illustrated. However, these examples are exemplary, and the present disclosure is not limited thereto.

EXAMPLES

Analysis Method

1. Photoluminescence Analysis

A photoluminescence (PL) spectrum of the produced nanocrystals are obtained using a Hitachi F-7000 spectrometer at an irradiation wavelength of 372 nanometers (nm).

2. Ultraviolet (UV) Spectroscopy Analysis

UV spectroscopy analysis is performed using a Hitachi U-3310 spectrometer to obtain a UV-Visible absorption spectrum.

3. Inductively Coupled Plasma (ICP) Analysis

An inductively coupled plasma-atomic emission spectroscopy (ICP-AES) analysis is performed using Shimadzu ICPS-8100.

4. Transmission Electron Microscopy (TEM) Analysis

Transmission electron microscopy photographs of nanocrystals are obtained using an UT F30 Tecnai electron microscope.

5. Electroluminescence Analysis

When a voltage is applied, a current depending on the voltage is measured by using a current-voltage (IV) tester 2635B manufactured by Keithley Co., Ltd. and using CS-2000A of Konica Minolta Co., Ltd., an electroluminescent brightness is measured.

Synthesis is performed under an inert gas atmosphere (nitrogen flowing condition) unless particularly mentioned. In the following examples or the like, a (amount) ratio between (or among) the precursors refers to a molar ratio unless defined to the contrary.

Synthesis of Quantum Dot Having a ZnTeSe Core and a ZnSe/ZnS Shell

Example 1

Selenium, sulfur, and tellurium are dispersed in trioctylphosphine (TOP) to obtain a 2 molar (M) Se/TOP stock solution, a 2 M S/TOP stock solution and a 0.1 M Te/TOP stock solution.

1. In a 300 milliliters (mL) reaction flask, zinc acetate is dissolved in trioctyl amine together with palmitic acid, and is heated under vacuum at 120° C. In one hour, an atmosphere in the reactor is converted into nitrogen.

After being heated at 300° C., the prepared Se/TOP stock solution and Te/TOP stock solution are rapidly added in a predetermined ratio. After 60 minutes, a reaction solution is rapidly cooled to room temperature and acetone is added thereto to obtain precipitates, which are separated via centrifugation. The obtained ZnSeTe cores are dispersed in toluene.

The ratio between the used Zn precursors and the used Se precursors (Zn:Se) is 2:1 and a ratio between the amount of Te and the amount of Se is 0.03:1 (Te:Se).

2. In a 300 mL reaction flask, trioctylamine is placed and zinc acetate and oleic acid are added thereto at a ratio of 2:1 and placed under vacuum at 120° C. The atmosphere inside the flask is replaced with nitrogen (N$_2$). While a temperature of the reaction flask is increased to 300° C., a toluene dispersion of the prepared ZnTeSe core is injected rapidly and then Se/TOP stock solution is added thereto and a reaction proceeds for 120 minutes to form a ZnSe layer on the core. Then, a S/TOP is added together with zinc acetate and a reaction proceeds for 120 min to form a ZnS layer on the ZnSe layer. A ratio between the amounts of the Zn precursor, the S precursor, and the Se precursor is about 3.5:2.5:1.

With respect to the quantum dots as prepared, an inductively coupled plasma atomic emission spectroscopic analysis is made and the results are summarized in Table 1.

With respect to the quantum dots as prepared, a photoluminescent analysis is made and the results are summarized in Table 2.

Example 2

A core-shell quantum dot is prepared in the same manner as Example 1 except that during the formation of the core, the ratio between the amounts of the Zn precursor and the Se precursor is 2:1, the ratio of the amounts of the Te precursor to the Se precursor (Te:Se) is 0.03:1, and, during the formation of the shell, a ratio between the amounts of the Zn precursor, the S precursor, and the Se precursor is about 3.8:2.8:1

With respect to the quantum dots as prepared, an inductively coupled plasma atomic emission spectroscopic analysis is made and the results are summarized in Table 1.

With respect to the quantum dots as prepared, a photoluminescent analysis is made and the results are summarized in Table 2.

With respect to the quantum dots as prepared, a transmission electron microscopic analysis is made. The results confirm that an average particle size of the quantum dots is about 12.3 nm.

Example 3

A core-shell quantum dot is prepared in the same manner as Example 1 except that during the formation of the core, the ratio between the amounts of the Zn precursor and the Se precursor is 2:1, the ratio of the amounts of the Te precursor to the Se precursor (Te:Se) is 0.03:1, and, during the formation of the shell, a ratio between the amounts of the Zn precursor, the S precursor, and the Se precursor is about 4.6:3.6:1

With respect to the quantum dots as prepared, an inductively coupled plasma atomic emission spectroscopic analysis is made and the results are summarized in Table 1.

With respect to the quantum dots as prepared, a photoluminescent analysis is made and the results are summarized in Table 2.

Example 4

A core-shell quantum dot is prepared in the same manner as Example 1 except that during the formation of the core, the ratio between the amounts of the Zn precursor and the Se precursor is 2:1, the ratio of the amounts of the Te precursor to the Se precursor (Te:Se) is 0.03:1, and, during the formation of the shell, a ratio between the amounts of the Zn precursor, the S precursor, and the Se precursor is about 3:2:1.

With respect to the quantum dots as prepared, an inductively coupled plasma atomic emission spectroscopic analysis is made and the results are summarized in Table 1.

With respect to the quantum dots as prepared, a photoluminescent analysis is made and the results are summarized in Table 2.

With respect to the quantum dots as prepared, a transmission electron microscopic analysis is made. The results confirm that an average particle size of the quantum dots is about 7.8 nm.

Example 5

A core-shell quantum dot is prepared in the same manner as Example 1 except that during the formation of the core, the ratio between the amounts of the Zn precursor and the Se precursor is 2:1, the ratio of the amounts of the Te precursor to the Se precursor (Te:Se) is 0.03:1, and, during the formation of the shell, a ratio between the amounts of the Zn precursor, the S precursor, and the Se precursor is about 3.4:2.4:1 With respect to the quantum dots as prepared, an inductively coupled plasma atomic emission spectroscopic analysis is made and the results are summarized in Table 1.

With respect to the quantum dots as prepared, a photoluminescent analysis is made and the results are summarized in Table 2.

TABLE 1

| | Mole ratio, X:Zn | | | | Mole ratio, (Se + S):Zn | Mole ratio, S:Se |
|---|---|---|---|---|---|---|
| | X = S | X = Zn | X = Se | X = Te | | |
| Example 4 | 0.43:1 | 1.00:1 | 0.46:1 | 0.002:1 | 0.89:1 | 0.94:1 |
| Example 5 | 0.51:1 | 1.00:1 | 0.43:1 | 0.002:1 | 0.94:1 | 1.19:1 |
| Example 1 | 0.51:1 | 1.00:1 | 0.41:1 | 0.002:1 | 0.92:1 | 1.24:1 |
| Example 2 | 0.58:1 | 1.00:1 | 0.41:1 | 0.002:1 | 0.99:1 | 1.41:1 |
| Example 3 | 0.56:1 | 1.00:1 | 0.31:1 | 0.002:1 | 0.88:1 | 1.81:1 |

TABLE 2

| | PL (nm) | Full Width at Half Maximum (FWHM) (nm) | Quantum Yield (QY) (%) | Mole ratio, S:Se |
|---|---|---|---|---|
| Example 4 | 445 | 30 | 72 | 0.94:1 |
| Example 5 | 450 | 25 | 71 | 1.19:1 |
| Example 1 | 450 | 29 | 85 | 1.24:1 |
| Example 2 | 447 | 18 | 84 | 1.41:1 |
| Example 3 | 448 | 21 | 75 | 1.81:1 |

The results of Table 1 and Table 2 confirm that the quantum dots of Examples may emit blue light with enhanced quantum efficiency and reduced FWHM.

Example 6

A core-shell quantum dot is prepared in the same manner as Example 1 except that during the formation of the quantum dot, the ratios of the precursors are controlled such that in a quantum dot thus prepared, the ratio of sulfur with respect to selenium is 0.78:1.

Comparative Example 1

A core-shell quantum dot is prepared in the same manner as Example 1 except that during the formation of the quantum dot, the ratios of the precursors are controlled such that in the quantum dot thus prepared, the ratio of sulfur with respect to selenium is 2.67:1

Example 7

A light emitting device is fabricated by using the quantum dot of Example 1 in the following manner. On a glass substrate with an ITO electrode (anode) as deposited, a poly(3,4-ethylenedioxythiophene):poly(styrene sulfonate) (PEDOT:PSS) layer and a poly(N-vinylcarbazole (PVK) layer is formed via a spin coating method as a hole injection layer and a hole transporting layer, respectively. Over the PVK layer thus formed, an octane dispersion of the quantum dots are spin-coated to form a quantum dot emission layer, and over the quantum dot emissive layer, a 2,2',2"-(1,3,5-

Benzinetriyl)-tris(1-phenyl-1-H-benzimidazole) (TPBi) layer is formed as an electron auxiliary layer, over which an aluminum electrode is vapor deposited.

For the prepared device, electroluminescent properties are evaluated and the results are summarized in Table 3.

Example 8

An electroluminescent device is prepared in the same manner as set forth in Example 7 except for using the quantum dots of Example 2 as the quantum dot. For the prepared device, electroluminescent properties are evaluated and the results are summarized in Table 3.

Example 9

An electroluminescent device is prepared in the same manner as set forth in Example 7 except for using the quantum dots of Example 6 as the quantum dot. For the prepared device, electroluminescent properties are evaluated and the results are summarized in Table 3.

Comparative Example 2

An electroluminescent device is prepared in the same manner as set forth in Example 7 except for using the quantum dots of Comparative Example 1 as the quantum dot. For the prepared device, electroluminescent properties are evaluated and the results are summarized in Table 3.

TABLE 3

|  | Maximum EQE (%) | Candelas per square meter (Cd/m$^2$) at 5 milliamperes (mA) | $\lambda_{max}$* (nm) | FWHM (nm) |
| --- | --- | --- | --- | --- |
| Example 7 | 6.3 | 134.1 | 452 | 33 |
| Example 8 | 6.5 | 133.5 | 452 | 29 |
| Example 9 | 6.8 | 145 | 452 | 19 |
| Comp. Example 2 | 2.4 | 55 | 446 | 21 |

*$\lambda_{max}$: peak emission wavelength

The results of Table 3 confirm that the devices including the quantum dots of Examples may exhibit significantly improved electroluminescent properties in comparison with the device including the quantum dots of Comparative Example.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising:
   a core comprising a first semiconductor nanocrystal material comprising zinc, tellurium, and selenium; and
   a semiconductor nanocrystal shell disposed on the core, the semiconductor nanocrystal shell comprising zinc, selenium, and sulfur,
   wherein the quantum dot does not comprise cadmium, and in the quantum dot, a mole ratio of sulfur with respect to selenium is less than or equal to about 2.4:1,
   wherein a maximum photoluminescent peak wavelength of the quantum dot is greater than or equal to about 430 nanometers and less than or equal to about 480 nanometers, and
   wherein in the quantum dot, a mole ratio of tellurium with respect to selenium is less than or equal to about 0.02:1.

2. The quantum dot of claim 1, wherein a maximum photoluminescent peak wavelength of the quantum dot is greater than or equal to about 440 nanometers and less than or equal to about 475 nanometers.

3. The quantum dot of claim 1, wherein the quantum dot has a size of greater than or equal to about 10 nanometers.

4. The quantum dot of claim 1, wherein in the quantum dot, a mole ratio of tellurium with respect to selenium is less than 0.01:1.

5. The quantum dot of claim 1, wherein in the quantum dot, the mole ratio of sulfur with respect to selenium is less than or equal to about 2.0:1.

6. The quantum dot of claim 1, wherein in the quantum dot, the mole ratio of sulfur with respect to selenium is less than or equal to about 1.85:1.

7. The quantum dot of claim 1, wherein a size of the core is greater than or equal to about 2 nanometers.

8. The quantum dot of claim 1, wherein the core comprises $ZnTe_xSe_{1-x}$, wherein x is greater than 0 and less than or equal to about 0.05.

9. The quantum dot of claim 1, wherein the semiconductor nanocrystal shell has a gradient composition varying in a radial direction from the core toward an outermost surface of the quantum dot.

10. The quantum dot of claim 9, wherein in the semiconductor nanocrystal shell, an amount of the sulfur increases in a radial direction from the core toward an outermost surface of the quantum dot.

11. The quantum dot of claim 1, wherein
   the semiconductor nanocrystal shell comprises a first layer disposed directly on the core, and a second layer disposed on the first layer, and
   the first layer comprises a second semiconductor nanocrystal and the second layer comprises a third semiconductor nanocrystal having a composition different from a composition of the second semiconductor nanocrystal.

12. The quantum dot of claim 11, wherein the second semiconductor nanocrystal comprises zinc, selenium, and optionally sulfur, and the third semiconductor nanocrystal comprises zinc and sulfur.

13. The quantum dot of claim 11, wherein the second layer is an outermost layer and the third semiconductor nanocrystal does not comprise selenium.

14. The quantum dot of claim 11, wherein
   the first semiconductor nanocrystal material comprises ZnTeSe,
   the second semiconductor nanocrystal material comprises ZnSe, and
   the second layer is an outermost layer and the third semiconductor nanocrystal comprises ZnS.

15. The quantum dot of claim 1, wherein a maximum photoluminescent peak wavelength of the quantum dot is greater than or equal to about 445 nanometers.

16. The quantum dot of claim 1, wherein the quantum dot has quantum efficiency of greater than or equal to about 70%.

17. The quantum dot of claim 1, wherein a full width at half maximum of a maximum photoluminescent peak of the quantum dot is less than or equal to about 30 nanometers.

18. The quantum dot of claim 1, wherein the quantum dot has a size of greater than or equal to about 12 nanometers.

19. An electroluminescent device comprising
   a first electrode and a second electrode facing each other, and a light emitting layer disposed between the first electrode and the second electrode, wherein the light emitting layer comprises a plurality of quantum dots and the plurality of quantum dots comprises the quantum dot of claim 1.

20. The electroluminescent device of claim 19, further comprising a charge auxiliary layer between the first electrode and the light emitting layer, between the second electrode and the light emitting layer, or between the first electrode and the light emitting layer and between the second electrode and the light emitting layer.

21. The electroluminescent device of claim 20, wherein the charge auxiliary layer comprises a charge injection layer, a charge transport layer, or a combination thereof.

22. The electroluminescent device of claim 19, wherein a peak external quantum efficiency of the electroluminescent device is greater than or equal to about 4%.

23. The electroluminescent device of claim 19, wherein the electroluminescent device emits light having an x value of a CIE color space chromaticity diagram that is less than or equal to about 0.2.

* * * * *